United States Patent
Kim et al.

(10) Patent No.: US 10,991,405 B1
(45) Date of Patent: Apr. 27, 2021

(54) SEMICONDUCTOR DEVICES

(71) Applicant: SK hynix Inc., Icheon-si (KR)

(72) Inventors: Woongrae Kim, Icheon-si (KR); Geun Ho Choi, Icheon-si (KR); Kyung Mook Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/868,078

(22) Filed: May 6, 2020

(30) Foreign Application Priority Data

Dec. 19, 2019 (KR) .......................... 10-2019-0171270

(51) Int. Cl.
*G11C 7/12* (2006.01)
*G11C 7/22* (2006.01)
*G11C 7/10* (2006.01)

(52) U.S. Cl.
CPC ............ *G11C 7/222* (2013.01); *G11C 7/1036* (2013.01); *G11C 7/1048* (2013.01); *G11C 7/12* (2013.01); *G11C 2207/229* (2013.01); *G11C 2207/2272* (2013.01)

(58) Field of Classification Search
CPC ..... G11C 7/222; G11C 7/1048; G11C 7/1036; G11C 7/12; G11C 2207/2272; G11C 2207/229
See application file for complete search history.

(56) References Cited

U.S. PATENT DOCUMENTS

| | | | |
|---|---|---|---|
| 2007/0008808 A1* | 1/2007 | Schnieder | G11C 11/4094 365/189.18 |
| 2019/0027199 A1 | 1/2019 | Lee et al. | |
| 2020/0160896 A1* | 5/2020 | Kwak | G11C 7/22 |
| 2020/0176035 A1* | 6/2020 | Kim | G11C 7/1087 |

FOREIGN PATENT DOCUMENTS

KR 100682429 B1 2/2007

* cited by examiner

*Primary Examiner* — Jay W. Radke
(74) *Attorney, Agent, or Firm* — William Park & Associates Ltd.

(57) ABSTRACT

A semiconductor device includes a flag shifting circuit and an auto-pre-charge control circuit. The flag shifting circuit generates a first shifted flag signal by shifting a first flag signal by a second latency period, the first flag signal generated based on a first operation clock signal, and configured to generate a second shifted flag signal by shifting a second flag signal by a first latency period, the second flag signal generated based on a second operation clock signal. The auto-pre-charge control circuit generates an auto-pre-charge signal by shifting the first shifted flag signal and the second shifted flag signal by a recovery period based on the first operation clock signal and the second operation clock signal.

27 Claims, 11 Drawing Sheets

SEMICONDUCTOR DEVICES

CROSS-REFERENCE TO RELATED APPLICATIONS

The present application claims priority under 35 U.S.C 119(a) to Korean Patent Application No. 10-2019-0171270, filed on Dec. 19, 2019, which is incorporated herein by reference in its entirety.

BACKGROUND

1. Technical Field

Embodiments of the present disclosure relate to semiconductor devices related to performance of an auto-pre-charge operation.

2. Related Art

As an operation speed of semiconductor devices becomes faster, the semiconductor devices have employed a design scheme for an auto-pre-charge operation instead of a design scheme for a pre-charge operation performed by a pre-charge command. The auto-pre-charge operation may correspond to a pre-charge operation which is automatically performed after a read operation or a write operation is performed by a command generated in the semiconductor device.

SUMMARY

According to an embodiment, a semiconductor device includes a flag shifting circuit and an auto-pre-charge control circuit. The flag shifting circuit may be configured to generate a first shifted flag signal by shifting a first flag signal by a second latency period, the first flag signal generated based on a first operation clock signal, and configured to generate a second shifted flag signal by shifting a second flag signal by a first latency period, the second flag signal generated based on a second operation clock signal. The auto-pre-charge control circuit may be configured to generate an auto-pre-charge signal by shifting the first shifted flag signal and the second shifted flag signal by a recovery period based on the first operation clock signal and the second operation clock signal.

According to another embodiment, a semiconductor device includes an auto-pre-charge control circuit. The auto-pre-charge control circuit may be configured to output a first shifted flag signal as an input auto-pre-charge signal or to output the input auto-pre-charge signal by shifting a second shifted flag signal by a first period based on an input selection signal. The auto-pre-charge control circuit may be configured to output a pre-auto-pre-charge signal by shifting the input auto-pre-charge signal by a second period set according to a recovery period. The auto-pre-charge control circuit may be configured to output a pre-charge signal by shifting the pre-auto-pre-charge signal by a third period or to output the pre-charge signal by shifting the pre-auto-pre-charge signal by a fourth period based on an output selection signal.

DETAILED DESCRIPTION

In the following description of the embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

Various embodiments of the present disclosure will be described hereinafter in detail with reference to the accompanying drawings. However, the embodiments described herein are for illustrative purposes only and are not intended to limit the scope of the present disclosure.

Figure 1:
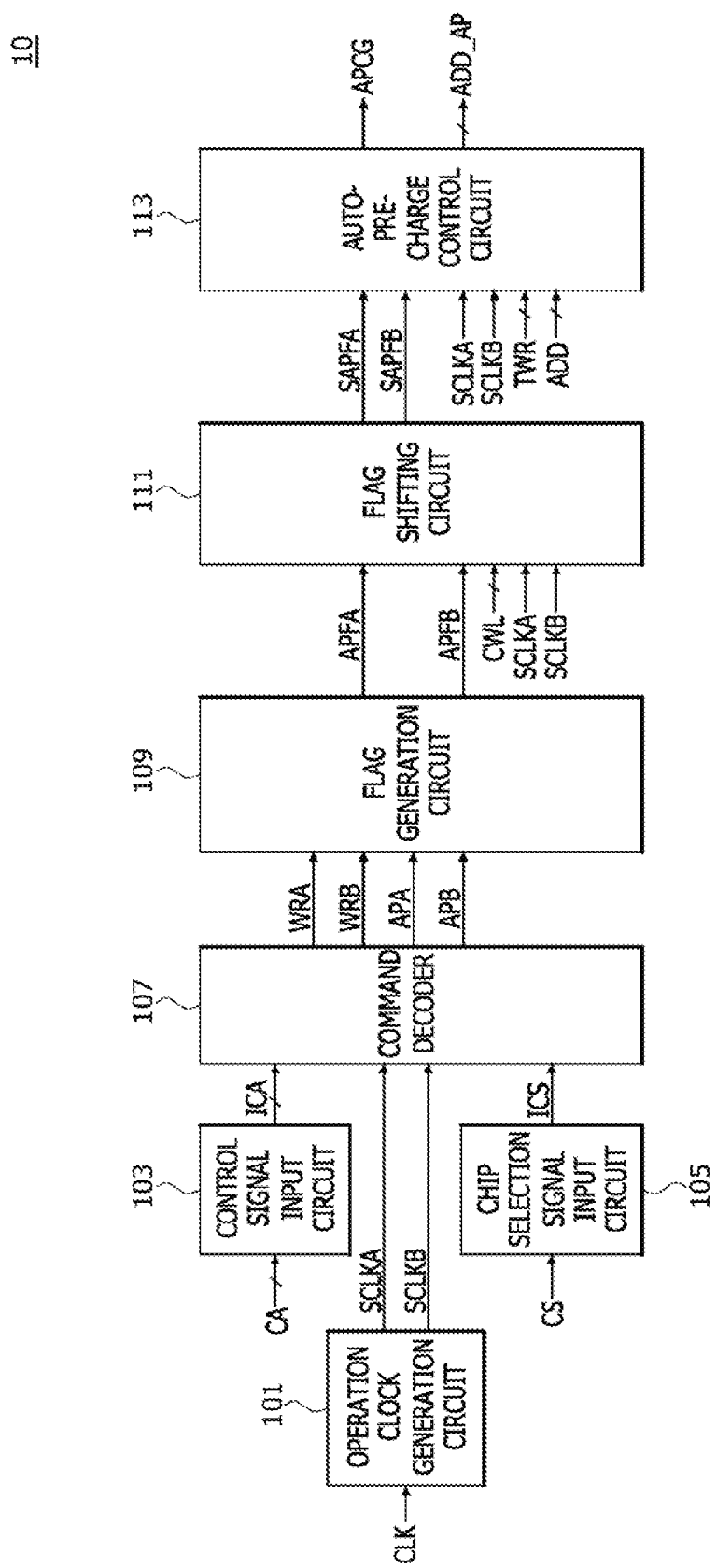
FIG. 1 is a block diagram illustrating a configuration of a semiconductor device according to an embodiment of the present disclosure.

FIG. 1 is a block diagram illustrating a configuration of a semiconductor device 10 according to an embodiment of the present disclosure. As illustrated in FIG. 1, the semiconductor device 10 may include an operation clock generation circuit 101, a control signal input circuit 103, a chip selection signal input circuit 105, and a command decoder 107, a flag generation circuit 109, a flag shifting circuit 111, and an auto-pre-charge control circuit 113.

The operation clock generation circuit 101 may divide a clock signal CLK to generate a first operation clock signal SCLKA and a second operation clock signal SCLKB. The first operation clock signal SCLKA and the second operation clock signal SCLKB may be generated as two-division signals of the clock signal CLK. A cycle of the first operation clock signal SCLKA and the second operation clock signal SCLKB may be set to be twice a cycle of the clock signal CLK. The second operation clock signal SCLKB may be generated to be an inverted signal of the first operation clock signal SCLKA.

The control signal input circuit 103 may generate an internal control signal ICA based on a control signal CA. The control signal input circuit 103 may be realized to include a buffer circuit (not illustrated) for outputting the internal control signal ICA by buffering the control signal CA.

The chip selection signal input circuit 105 may generate an internal chip selection signal ICS based on a chip selection signal CS. The chip selection signal input circuit 105 may be realized to include a buffer circuit (not illustrated) for outputting the internal chip selection signal ICS by buffering the chip selection signal CS.

The command decoder 107 may generate a first write command signal WRA, a second write command signal WRB, a first auto-pre-charge command signal APA, and a second auto-pre-charge command signal ABP based on the first operation clock signal SCLKA, the second operation clock signal SCLKB, the internal control signal ICA, and the internal chip selection signal ICS. The command decoder 107 may generate the first write command signal WRA and the first auto-pre-charge command signal APA by decoding the internal control signal ICA received in synchronization with the first operation clock signal SCLKA while the internal chip selection signal ICS has a predetermined logic level. Logic level combinations of the internal control signal ICA for generating the first write command signal WRA and the first auto-pre-charge command signal APA in synchronization with the first operation clock signal SCLKA may be set to be different according to the embodiments. The command decoder 107 may generate the second write command signal WRB and the second auto-pre-charge command signal APB by decoding the internal control signal ICA received in synchronization with the second operation clock signal SCLKB while the internal chip selection signal ICS has a predetermined logic level. Logic level combinations of the internal control signal ICA for generating the second write command signal WRB and the second auto-pre-charge command signal APB in synchronization with the second operation clock signal SCLKB may be set to be different according to the embodiments.

The flag generation circuit 109 may generate a first flag signal APFA and a second flag signal APFB based on the first write command signal WRA, the second write command signal WRB, the first auto-pre-charge command signal APA, and the second auto-pre-charge command signal APB. The flag generation circuit 109 may generate the first flag signal APFA when the first write command signal WRA and the first auto-pre-charge command signal APA are generated. The flag generation circuit 109 may generate the second flag signal APFB when the second write command signal WRB and the second auto-pre-charge command signal APB are generated.

The flag shifting circuit 111 may generate a first shifted flag signal SAPFA and a second shifted flag signal SAPFB by shifting the first flag signal APFA and the second flag signal APFB based on a write latency code signal CWL, the first operation clock signal SCLKA, and the second operation clock signal SCLKB. The write latency code signal CWL may include bits having a logic level combination corresponding to a latency period which is set based on a write latency WL. In an embodiment, the latency period may be set to correspond to a period of the write latency WL+8×tCK. For example, when the write latency WL is set to be 12×tCK, the latency period may be set to be 20×tCK. "tCK" means one cycle of the clock signal CLK.

The auto-pre-charge control circuit 113 may generate an auto-pre-charge signal APCG and an auto-pre-charge address signal ADD_AP based on the first shifted flag signal SAPFA, the second shifted flag signal SAPFB, the first operation clock signal SCLKA, the second operation clock signal SCLKB, a write recovery code signal TWR, an address signal ADD. The auto-pre-charge control circuit 113 may generate the auto-pre-charge signal APCG by shifting the first shifted flag signal SAPFA by a recovery period which is set by the write recovery code signal TWR in synchronization with the first operation clock signal SCLKA and the second operation clock signal SCLKB when the first shifted flag signal SAPFA is generated. The auto-pre-charge control circuit 113 may generate the auto-pre-charge signal APCG by shifting the second shifted flag signal SAPFB by the recovery period which is set by the write recovery code signal TWR in synchronization with the first operation clock signal SCLKA and the second operation clock signal SCLKB when the second shifted flag signal SAPFB is generated. The auto-pre-charge control circuit 113 may latch the address signal ADD based on the first shifted flag signal SAPFA and the second shifted flag signal SAPFB and may output the latched address signal ADD as the auto-pre-charge address signal ADD_AP at a time when the recovery period set by the write recovery code signal TWR elapses.

Figure 2:
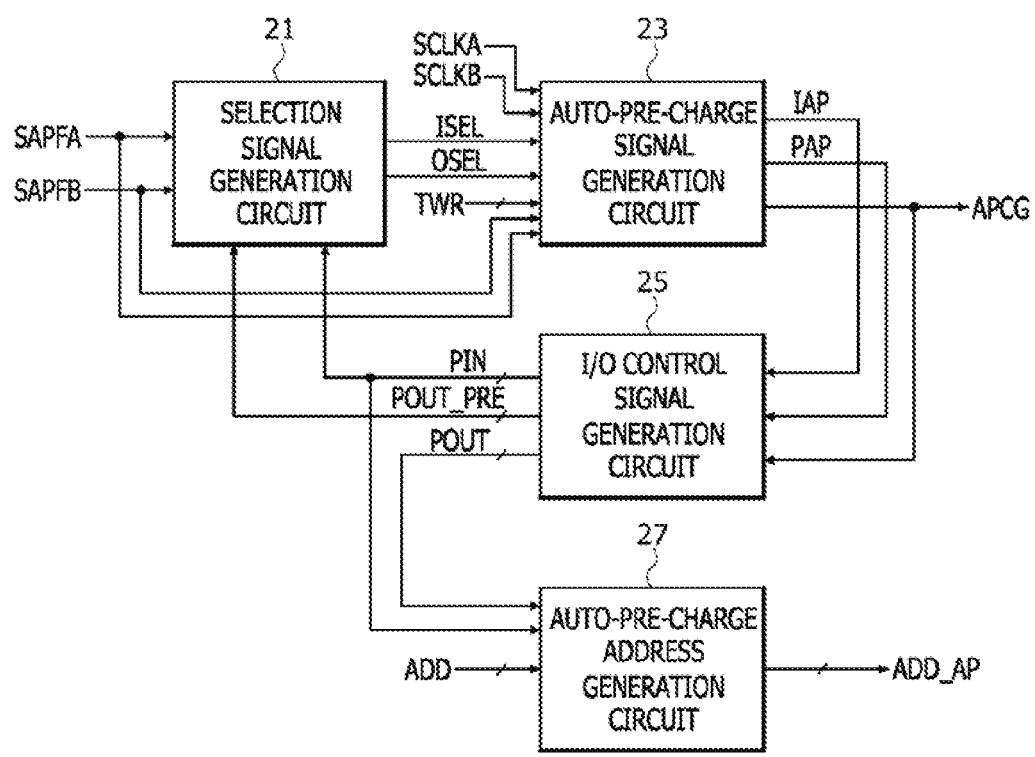
FIG. 2 is a block diagram illustrating a configuration of an auto-pre-charge control circuit included in the semiconductor device of FIG. 1.

FIG. 2 is a block diagram illustrating a configuration of the auto-pre-charge control circuit 113. As illustrated in FIG. 2, the auto-pre-charge control circuit 113 may include a selection signal generation circuit 21, an auto-pre-charge signal generation circuit 23, an input/output (I/O) control signal generation circuit 25, and an auto-pre-charge address generation circuit 27.

The selection signal generation circuit 21 may generate an input selection signal ISEL and an output selection signal OSEL based on the first shifted flag signal SAPFA, the second shifted flag signal SAPFB, an input control signal PIN, and a pre-output control signal POUT_PRE. The selection signal generation circuit 21 may generate the input selection signal ISEL having a logic level that is set according to the first shifted flag signal SAPFA and the second shifted flag signal SAPFB. For example, the selection signal generation circuit 21 may set the input selection signal ISEL having a first logic level when the first shifted flag signal SAPFA is generated and may set the input selection signal ISEL having a second logic level when the second shifted flag signal SAPFB is generated. In an embodiment, the first logic level may be set to be a logic "low" level, and the second logic level may be set to be a logic "high" level. The selection signal generation circuit 21 may latch the input selection signal ISEL based on the input control signal PIN and may output the latched input selection signal ISEL as the output selection signal OSEL based on the pre-output control signal POUT_PRE.

The auto-pre-charge signal generation circuit 23 may generate an input auto-pre-charge signal IAP, a pre-auto-pre-charge signal PAP, and the auto-pre-charge signal APCG based on the first operation clock signal SCLKA, the second operation clock signal SCLKB, the input selection signal ISEL, the output selection signal OSEL, the write recovery code signal TWR, the first shifted flag signal SAPFA, and the second shifted flag signal SAPFB. The auto-pre-charge signal generation circuit 23 may output the first shifted flag signal SAPFA as the input auto-pre-charge signal IAP when the first shifted flag signal SAPFA is generated. The auto-pre-charge signal generation circuit 23 may output the input auto-pre-charge signal IAP by shifting the second shifted flag signal SAPFB by a half cycle (one cycle of the clock signal CLK) of the first operation clock signal SCLKA when the second shifted flag signal SAPFB is generated. The auto-pre-charge signal generation circuit 23 may generate the pre-auto-pre-charge signal PAP by shifting the input auto-pre-charge signal IAP based on the write recovery code signal TWR. The auto-pre-charge signal generation circuit 23 may generate the pre-auto-pre-charge signal PAP by shifting the input auto-pre-charge signal IAP by a period that remains after subtracting one cycle (two cycles of the clock signal CLK) of the first operation clock signal SCLKA from a recovery period which is set by the write recovery code signal TWR. The auto-pre-charge signal generation circuit 23 may generate and output the auto-pre-charge signal APCG by shifting the pre-auto-pre-charge signal PAP by one cycle (two cycles of the clock signal CLK) of the first operation clock signal SCLKA when the first shifted flag signal SAPFA is generated. The auto-pre-charge signal generation circuit 23 may generate and output the auto-pre-charge signal APCG by shifting the pre-auto-pre-charge signal PAP by a half cycle (one cycle of the clock signal CLK) of the first operation clock signal SCLKA when the second shifted flag signal SAPFB is generated.

The input/output control signal generation circuit 25 may generate the input control signal PIN, the pre-output control signal POUT_PRE, and an output control signal POUT based on the input auto-pre-charge signal IAP, the pre-auto-pre-charge signal PAP, and the auto-pre-charge signal APCG. The input/output control signal generation circuit 25 may generate the input control signal PIN based on the input auto-pre-charge signal IAP. The input/output control signal generation circuit 25 may sequentially generate bit signals included in the input control signal PIN whenever the input auto-pre-charge signal IAP is generated. For example, the input/output control signal generation circuit 25 may generate a first bit signal PIN<1> of the input control signal PIN when the input auto-pre-charge signal IAP is generated a first time and may generate a second bit signal PIN<2> of the input control signal PIN when the input auto-pre-charge signal IAP is generated a second time. The input/output control signal generation circuit 25 may generate the pre-output control signal POUT_PRE based on the pre-auto-pre-charge signal PAP. The input/output control signal generation circuit 25 may sequentially generate bit signals included in the pre-output control signal POUT_PRE whenever the pre-auto-pre-charge signal PAP is generated. For example, the input/output control signal generation circuit 25 may generate a first bit signal POUT_PRE<1> of the pre-output control signal POUT_PRE when the pre-auto-pre-charge signal PAP is generated a first time and may generate a second bit signal POUT_PRE<2> of the pre-output control signal POUT_PRE when the pre-auto-pre-charge signal PAP is generated a second time. The input/output control signal generation circuit 25 may generate the output control signal POUT based on the auto-pre-charge signal APCG. The input/output control signal generation circuit 25 may sequentially generate bit signals included in the output control signal POUT whenever the auto-pre-charge signal APCG is generated. For example, the input/output control signal generation circuit 25 may generate a first bit signal POUT<1> of the output control signal POUT when the auto-pre-charge signal APCG is generated a first time and may generate a second bit signal POUT<2> of the output control signal POUT when the auto-pre-charge signal APCG is generated a second time.

The auto-pre-charge address generation circuit 27 may generate the auto-pre-charge address signal ADD_AP from the address signal ADD based on the input control signal PIN and the output control signal POUT. The auto-pre-charge address generation circuit 27 may latch the address signal ADD according to the input control signal PIN and may output the latched address signal ADD as the auto-pre-charge address signal ADD_AP according to the output control signal POUT.

Figure 3:
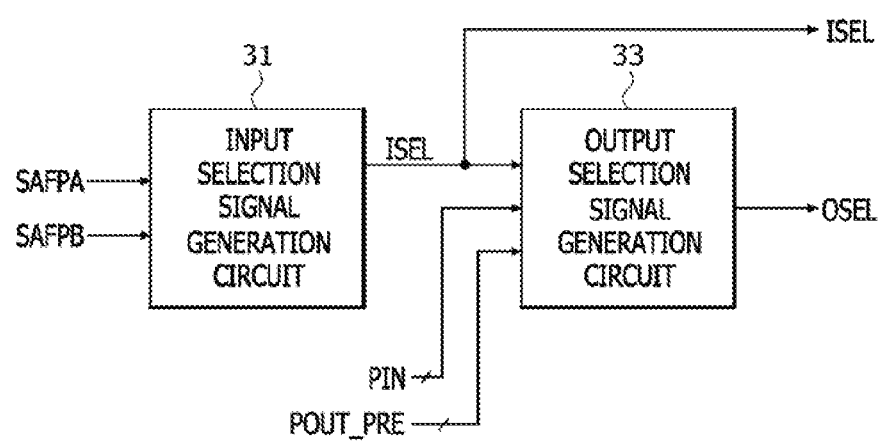
FIG. 3 is a block diagram illustrating a configuration of a selection signal generation circuit included in the auto-pre-charge control circuit of FIG. 2.

FIG. 3 is a block diagram illustrating a configuration of the selection signal generation circuit 21. As illustrated in FIG. 3, the selection signal generation circuit 21 may include an input selection signal generation circuit 31 and an output selection signal generation circuit 33.

The input selection signal generation circuit 31 may generate the input selection signal ISEL having a logic level that is set according to the first shifted flag signal SAPFA and the second shifted flag signal SAPFB. The input selection signal generation circuit 31 may generate the input selection signal ISEL having a first logic level when the first shifted flag signal SAPFA is generated and may generate the input selection signal ISEL having a second logic level when the second shifted flag signal SAPFB is generated. For example, the input selection signal generation circuit 31 may set the input selection signal ISEL having a logic "low" level when the first shifted flag signal SAPFA is generated and may set the input selection signal ISEL having a logic "high" level when the second shifted flag signal SAPFB is generated.

The output selection signal generation circuit 33 may latch the input selection signal ISEL based on the input control signal PIN and may output the latched input selection signal ISEL as the output selection signal OSEL based on the pre-output control signal POUT_PRE. For example, the output selection signal generation circuit 33 may latch the input selection signal ISEL when an $L^{th}$ bit signal PIN<L> of the input control signal PIN is generated and may output the latched input selection signal ISEL as the output selection signal OSEL when the $L^{th}$ bit signal POUT_PRE<L> of the pre-output control signal POUT_PRE is generated.

Figure 4:
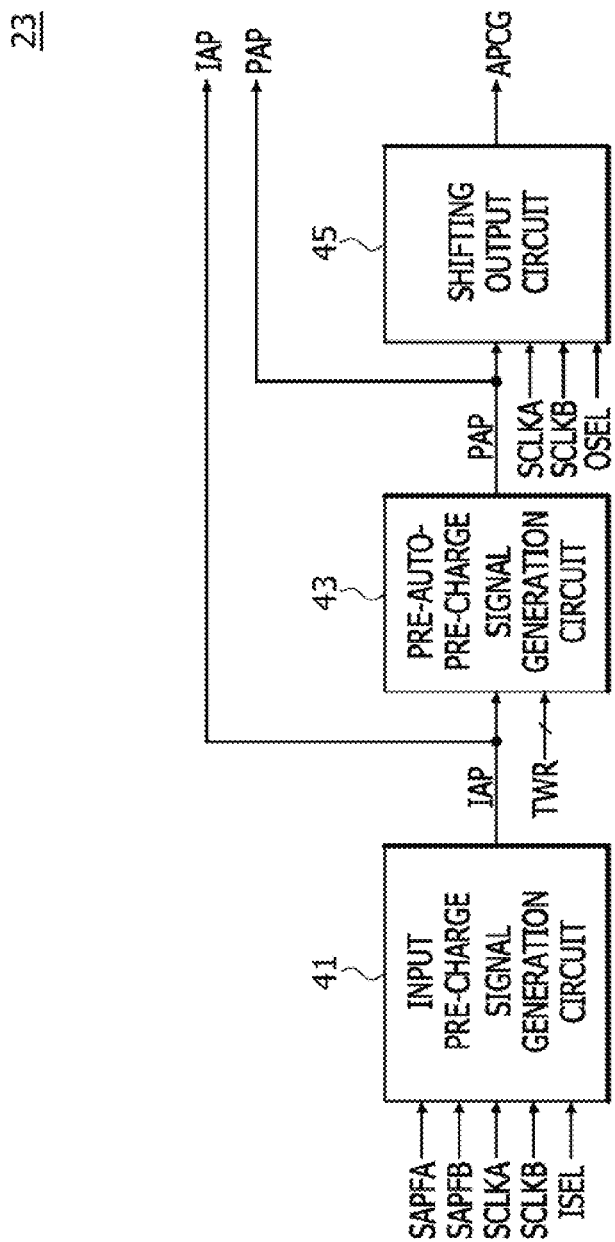
FIG. 4 is a block diagram illustrating a configuration of an auto-pre-charge signal generation circuit included in the auto-pre-charge control circuit of FIG. 2.

FIG. 4 is a block diagram illustrating a configuration of the auto-pre-charge signal generation circuit 23. As illustrated in FIG. 4, the auto-pre-charge signal generation circuit 23 may include an input pre-charge signal generation circuit 41, a pre-auto-pre-charge signal generation circuit 43, and a shifting output circuit 45.

The input pre-charge signal generation circuit 41 may output the first shifted flag signal SAPFA as the input auto-pre-charge signal IAP based on the input selection signal ISEL having a first logic level when the first shifted flag signal SAPFA is generated. The input pre-charge signal generation circuit 41 may generate and output the input auto-pre-charge signal IAP by shifting the second shifted flag signal SAPFB by a half cycle (one cycle of the clock signal CLK) of the first operation clock signal SCLKA according to the input selection signal ISEL having a second logic level when the second shifted flag signal SAPFB is generated.

The pre-charge signal generation circuit 43 may generate the pre-auto-pre-charge signal PAP by shifting the input auto-pre-charge signal IAP by a period that remains after subtracting one cycle (two cycles of the clock signal CLK) of the first operation clock signal SCLKA from a recovery period set by the write recovery code signal TWR.

The shifting output circuit 45 may generate and output the auto-pre-charge signal APCG by shifting the pre-auto-pre-charge signal PAP by one cycle (two cycles of the clock signal CLK) of the first operation clock signal SCLKA based on the output selection signal OSEL having a first logic level when the first shifted flag signal SAPFA is generated. The shifting output circuit 45 may generate and output the auto-pre-charge signal APCG by shifting the pre-auto-pre-charge signal PAP by a half cycle (one cycle of the clock signal CLK) of the first operation clock signal SCLKA based on the output selection signal OSEL having a second logic level when the second shifted flag signal SAPFB is generated.

Figure 5:
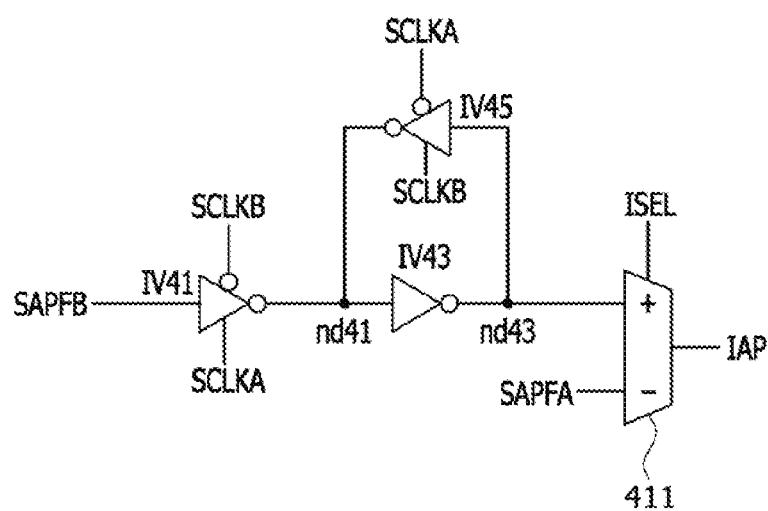
FIG. 5 is a circuit diagram illustrating an input pre-charge signal generation circuit included in the auto-pre-charge signal generation circuit of FIG. 4.

FIG. 5 is a circuit diagram of the input pre-charge signal generation circuit 41.

As illustrated in FIG. 5, the input pre-charge signal generation circuit 41 may include inverters IV41, IV43, and IV45 and a selector 411 electrically connected to each other. When the first operation clock signal SCLKA has a logic "high" level and the second operation clock signal SCLKB has a logic "low" level, the inverter IV41 may inversely buffer the second shifted flag signal SAPFB to output the inversely buffered signal to a node nd41. The inverter IV43 may inversely buffer a signal of the node nd41 to output the inversely buffered signal to a node nd43. When the first operation clock signal SCLKA has a logic "low" level and the second operation clock signal SCLKB has a logic "high" level, the inverter IV45 may inversely buffer a signal of the node nd43 to output the inversely buffered signal to the node nd41. The selector 411 may output a signal of the node nd43 as the input auto-pre-charge signal IAP when the input selection signal ISEL has a logic "high" level. The selector 411 may output the first shifted flag signal SAPFA as the input auto-pre-charge signal IAP when the input selection signal ISEL has a logic "low" level. The input pre-charge signal generation circuit 41 may output the first shifted flag signal SAPFA as the input auto-pre-charge signal IAP when the input selection signal ISEL has a logic "low" level. The input pre-charge signal generation circuit 41 may generate and output the input auto-pre-charge signal IAP by shifting the second shifted flag signal SAPFB by a half cycle (one cycle of the clock signal CLK) of the first operation clock signal SCLKA when the input selection signal ISEL has a logic "high" level.

Figure 6:
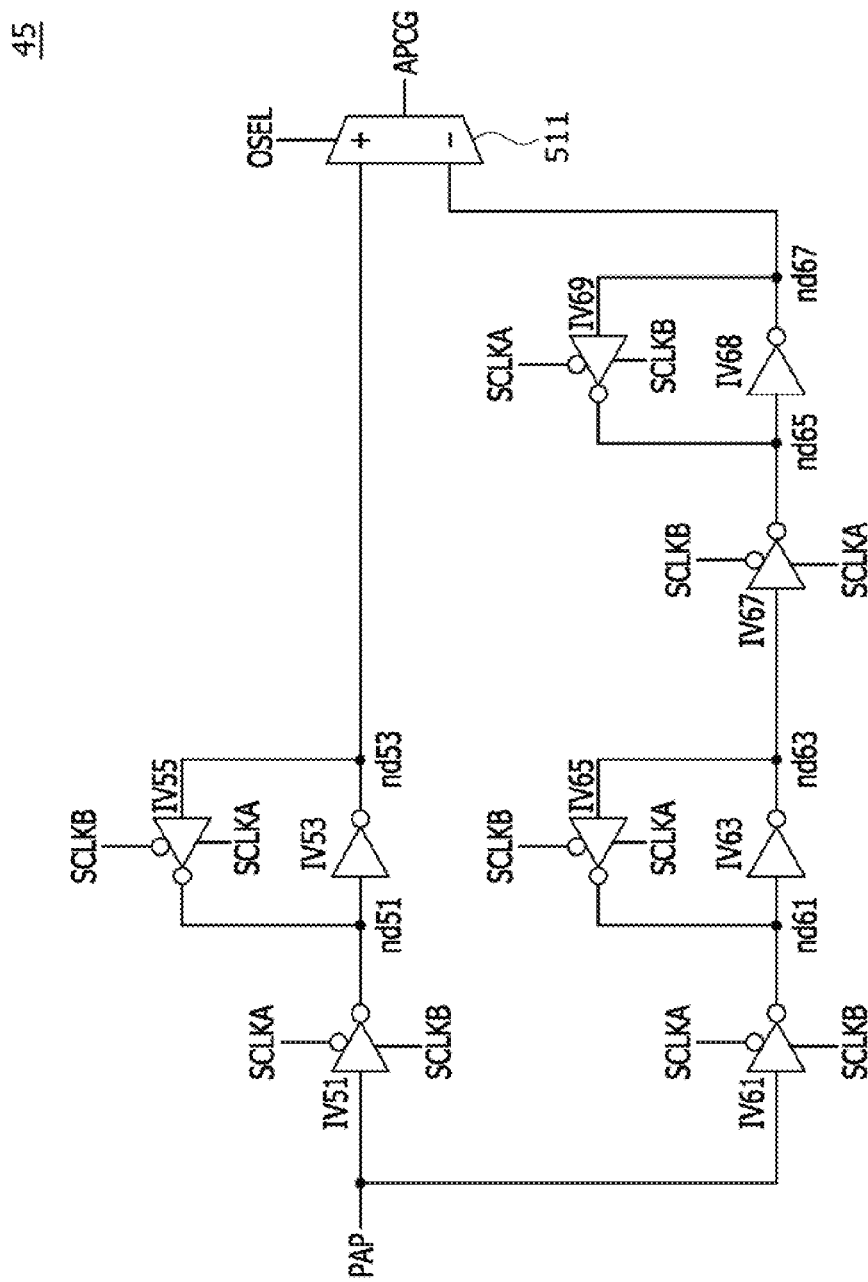
FIG. 6 is a circuit diagram illustrating a shifting output circuit included in the auto-pre-charge signal generation circuit of FIG. 4.

FIG. 6 is a circuit diagram of the shifting output circuit 45. As illustrated in FIG. 6, the shifting output circuit 45 may include inverters IV51, IV53, IV55, IV61, IV63, IV65, IV67, IV68, and IV69 and a selector 511 electrically connected to each other.

When the first operation clock signal SCLKA has a logic "low" level and the second operation clock signal SCLKB has a logic "high" level, the inverter IV51 may inversely buffer the pre-auto-pre-charge signal PAP to output the inversely buffered signal to a node nd51. The inverter IV53 may inversely buffer a signal of the node nd51 to output the inversely buffered signal to a node nd53. When the first operation clock signal SCLKA has a logic "high" level and the second operation clock signal SCLKB has a logic "low" level, the inverter IV55 may inversely buffer a signal of the node nd53 to output the inversely buffered signal to the node nd51. When the first operation clock signal SCLKA has a logic "low" level and the second operation clock signal SCLKB has a logic "high" level, the inverter IV61 may inversely buffer the pre-auto-pre-charge signal PAP to output the inversely buffered signal to a node nd61. The inverter IV63 may inversely buffer a signal of the node nd61 to output the inversely buffered signal to a node nd63. When the first operation clock signal SCLKA has a logic "high" level and the second operation clock signal SCLKB has a logic "low" level, the inverter IV65 may inversely buffer a signal of the node nd63 to output the inversely buffered signal to the node nd61. When the first operation clock signal SCLKA has a logic "high" level and the second operation clock signal SCLKB has a logic "low" level, the inverter IV67 may inversely buffer a signal of the node nd63 to output the inversely buffered signal to a node nd65. The inverter IV68 may inversely buffer a signal of the node nd65 to output the inversely buffered signal to a node nd67. When the first operation clock signal SCLKA has a logic "low" level and the second operation clock signal SCLKB has a logic "high" level, the inverter IV69 may inversely buffer a signal of the node nd67 to output the inversely buffered signal to the node nd65. The selector 511 may output the signal of the node nd53 as the auto-pre-charge signal APCG when the output selection signal OSEL has a logic "high" level. The selector 511 may output a signal of the node nd67 as the auto-pre-charge signal APCG when the output selection signal OSEL has a logic "low" level. The shifting output circuit 45 may generate and output the auto-pre-charge signal APCG by shifting pre-auto-pre-charge signal PAP by a half cycle (one cycle of the clock signal CLK) of the first operation clock signal SCLKA when the output selection signal OSEL has a logic "high" level. The shifting output circuit 45 may generate and output the auto-pre-charge signal APCG by shifting the pre-auto-pre-charge signal PAP by one cycle (two cycles of the clock signal CLK) of the first operation clock signal SCLKA when the output selection signal OSEL has a logic "low" level.

Figure 7:
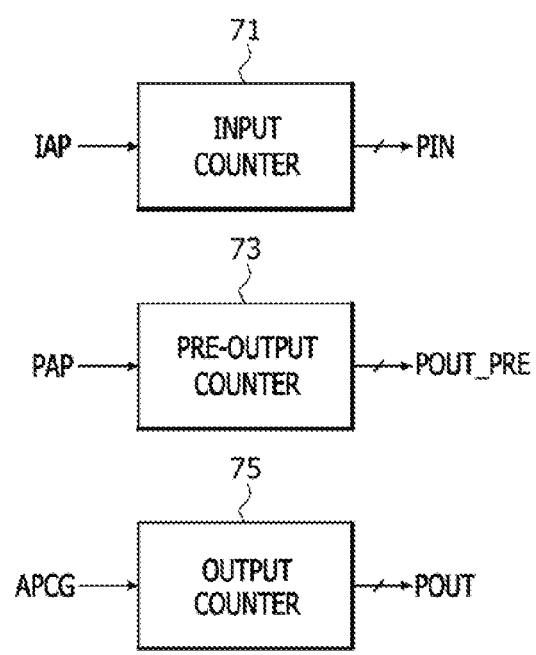
FIG. 7 is a block diagram illustrating a configuration of an input/output (I/O) control signal generation circuit included in the auto-pre-charge control circuit of FIG. 2.

FIG. 7 is a block diagram illustrating a configuration of the input/output control signal generation circuit 25. As illustrated in FIG. 7, the input/output control signal generation circuit 25 may include an input counter 71, a pre-output counter 73, and an output counter 75.

The input counter 71 may generate the input control signal PIN based on the input auto-pre-charge signal IAP. For example, the input counter 71 may generate the first bit signal PIN<1> of the input control signal PIN when the input auto-pre-charge signal IAP is generated a first time and may generate the second bit signal PIN<2> of the input control signal PIN when the input auto-pre-charge signal IAP is generated a second time.

The pre-output counter 73 may generate the pre-output control signal POUT_PRE based on the pre-auto-pre-charge signal PAP. For example, the pre-output counter 73 may generate the first bit signal POUT_PRE<1> of the pre-output control signal POUT_PRE when the pre-auto-pre-charge signal PAP is generated a first time and may generate the second bit signal POUT_PRE<2> of the pre-output control signal POUT_PRE when the pre-auto-pre-charge signal PAP is generated a second time.

The output counter 75 may generate the output control signal POUT based on the auto-pre-charge signal APCG. For example, the output counter 75 may generate the first bit signal POUT<1> of the output control signal POUT when the auto-pre-charge signal APCG is generated a first time and may generate the second bit signal POUT<2> of the output control signal POUT when the auto-pre-charge signal APCG is generated a second time.

Figure 8:
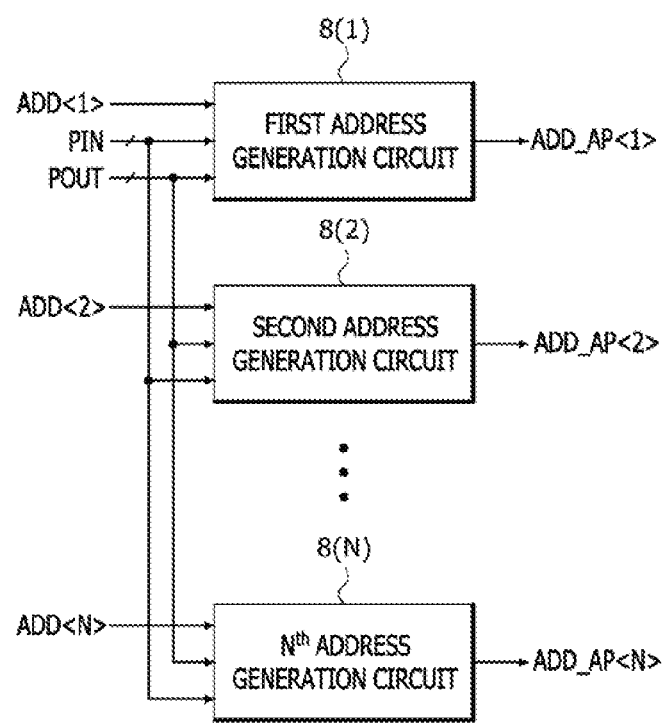
FIG. 8 is a block diagram illustrating a configuration of an auto-pre-charge address generation circuit included in the auto-pre-charge control circuit of FIG. 2.

FIG. 8 is a block diagram illustrating a configuration of the auto-pre-charge address generation circuit 27. As illustrated in FIG. 8, the auto-pre-charge address generation circuit 27 may include first to $N^{th}$ address generation circuits 8(1:N).

The first address generation circuit 8(1) may latch a first bit signal ADD<1> of an address signal ADD based on the input control signal PIN and may output the latched signal of the first bit signal ADD<1> of the address signal ADD as a first bit signal ADD_AP<1> of the auto-pre-charge address signal ADD_AP based on the output control signal POUT. The first bit signal ADD<1> of the address signal ADD may be one of a bank address, a row address, and a column address. The first address generation circuit 8(1) may latch the first bit signal ADD<1> of the address signal ADD when a $J^{th}$ bit signal PIN<J> of the input control signal PIN is generated and may output the first bit signal ADD<1> latched by the $J^{th}$ bit signal PIN<J> of the input control signal PIN as the first bit signal ADD_AP<1> of the auto-pre-charge address signal ADD_AP when a $J^{th}$ bit signal POUT<J> of the output control signal POUT is generated. "J" may be set as a natural number.

The second address generation circuit 8(2) may latch the second bit ADD<2> of the address signal ADD based on the input control signal PIN and output the latched signal of the second bit signal ADD<2> of the address signal ADD as a second bit signal ADD_AP<2> of the auto-pre-charge address signal ADD_AP based on the output control signal POUT. The second bit signal ADD<2> of the address signal ADD may be one of the bank address, the row address, and the column address. The second address generation circuit 8(2) may latch the second bit signal ADD<2> of the address signal ADD when a $K^{th}$ bit signal PIN<K> of the input control signal PIN is generated and may output the second bit signal ADD<2> latched by the $K^{th}$ bit signal PIN<K> of the input control signal PIN as the second bit signal ADD_AP<2> of the auto-pre-charge address signal ADD_AP when a $K^{th}$ bit signal POUT<K> of the output control signal POUT is generated. "K" may be set as a natural number.

The $N^{th}$ address generation circuit 8(N) may latch an $N^{th}$ bit signal ADD<N> of the address signal ADD based on the input control signal PIN and may output the latched signal of the $N^{th}$ bit signal ADD<N> of the address signal ADD as an $N^{th}$ bit signal ADD_AP<N> of the auto-pre-charge address signal ADD_AP based on the output control signal POUT. The $N^{th}$ bit signal ADD<N> of the address signal ADD may be one of the bank address, the row address, and the column address. The $N^{th}$ address generation circuit 8(N) may latch the $N^{th}$ bit signal ADD<N> of the address signal ADD when an $S^{th}$ bit signal PIN<S> of the input control signal PIN is generated and may output the $N^{th}$ bit signal ADD<N> latched by the $S^{th}$ bit signal PIN<S> of the input control signal PIN as the $N^{th}$ bit signal ADD_AP<N> of the auto-pre-charge address signal ADD_AP when an $S^{th}$ bit signal POUT<S> of the output control signal POUT is generated. "N" may be set as a natural number greater than or equal to 3, and "S" may be set as a natural number.

Figure 9:
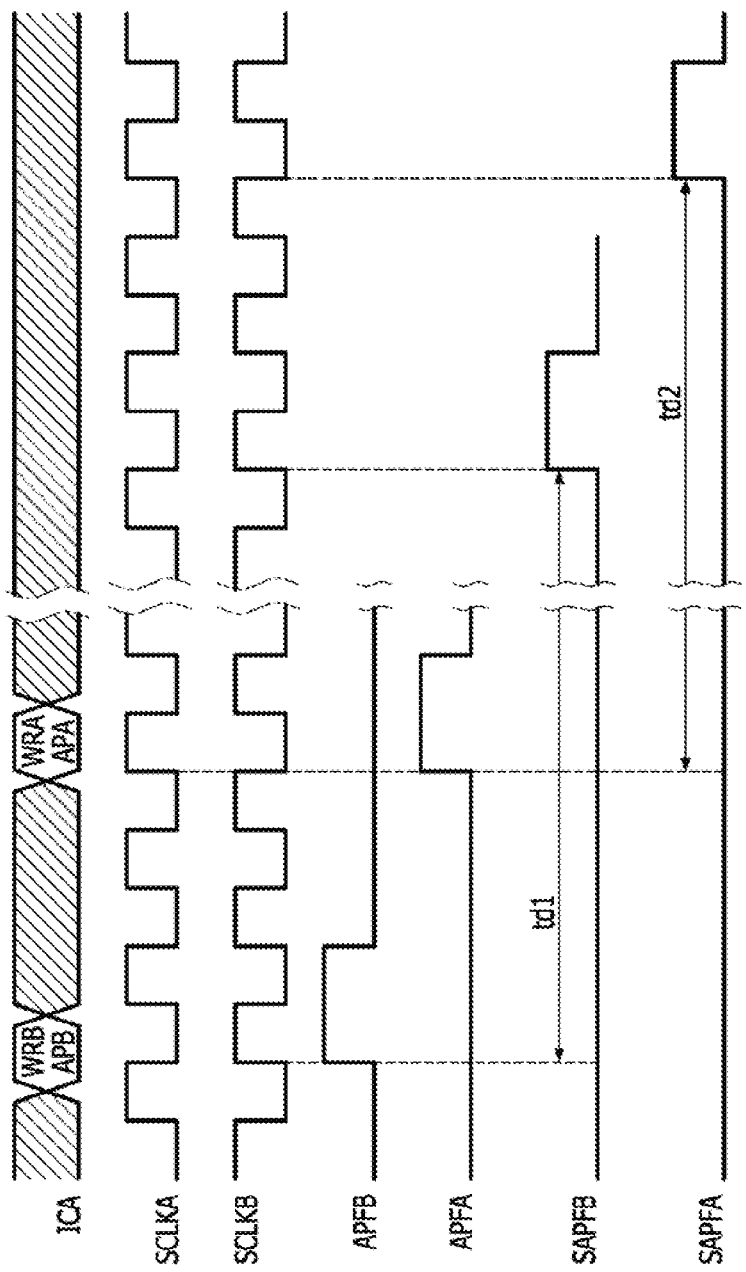
FIGS. 9 and 10 are timing diagrams illustrating an operation of the semiconductor device shown in FIG. 1.
Figure 10:
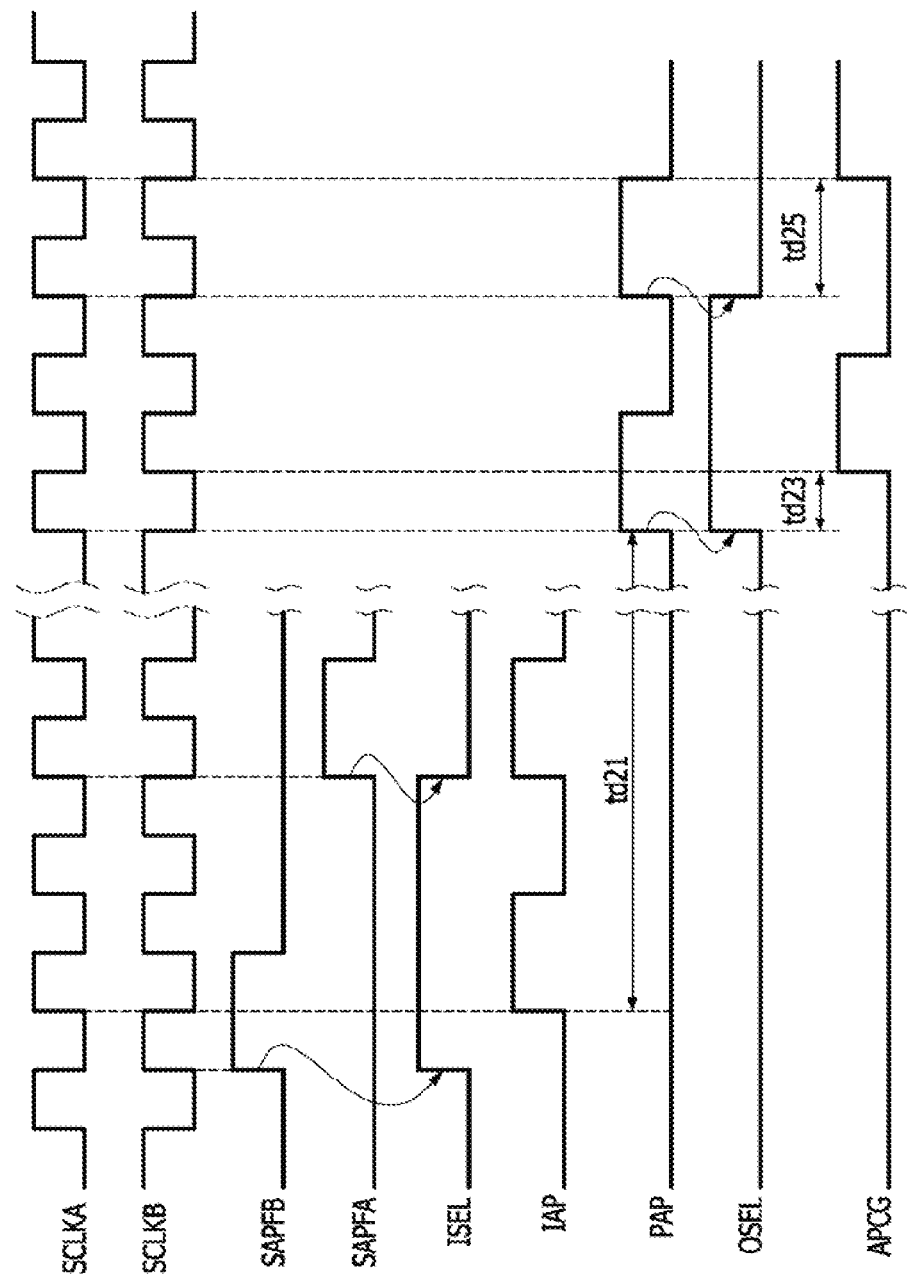

FIGS. 9 and 10 are timing diagrams illustrating an operation of the semiconductor device 10.

As illustrated in FIG. 9, when the second write command signal WRB and the second auto-pre-charge command signal APB are inputted through the internal control signal ICA in synchronization with a rising edge of the second operation clock signal SCLKB, the second flag signal APFB may be generated, and when the first write command signal WRA and the first auto-pre-charge command signal APA are inputted through the internal control signal ICA in synchronization with a rising edge of the first operation clock signal SCLKA, the first flag signal signal APFA may be generated. The second shifted flag signal SAPFB may be generated at a time when a first latency period td1 elapses from a time when the second flag signal APFB is generated, and the first shifted flag signal SAPFA may be generated at a time when a second latency period td2 elapses from a time when the first flag signal APFA is generated. Each of the first latency period td1 and the second latency period td2 may be set to be a period of the write latency WL+8×tCK.

As illustrated in FIG. 10, the input selection signal ISEL may be set to have a logic "high" level at a time when the second shifted flag signal SAPFB is generated, and the input selection signal ISEL may be set to have a logic "low" level at a time when the first shifted flag signal SAPFA is generated. While the input selection signal ISEL has a logic "high" level, the second shifted flag signal SAPFB may be shifted by a half cycle (one cycle of the clock signal CLK) of the first operation clock signal SCLKA to be outputted as the input auto-pre-charge signal IAP. While the input selection signal ISEL has a logic "low" level, the first shifted flag signal SAPFA may be outputted as the input auto-pre-charge signal IAP.

As illustrated in FIG. 10, the input auto-pre-charge signal IAP may be shifted by a period td21 obtained by subtracting one cycle (two cycles of the clock signal CLK) of the first operation clock signal SCLKA from a recovery period set by the write recovery code signal TWR to be outputted as the pre-auto-pre-charge signal PAP.

As illustrated in FIG. 10, the output selection signal OSEL may be set to have a logic "high" level when the pre-auto-pre-charge signal PAP is generated a first time and may be set to have a logic "low" level when the pre-auto-pre-charge signal PAP is generated a second time. During a period when the output selection signal OSEL has a logic "high" level, the pre-auto-pre-charge signal PAP may be shifted by a period td23 to be outputted as the auto-pre-charge signal APCG. The period td23 may be set as a half cycle (one cycle of the clock signal CLK) of the first operation clock signal SCLKA. During a period when the output selection signal OSEL has a logic "low" level, the pre-auto-pre-charge signal PAP may be shifted by a period td25 to be outputted as the auto-pre-charge signal APCG. The period td25 may be set to be one cycle (two cycles of the clock signal CLK) of the first operation clock signal SCLKA.

As described above, the semiconductor device 10 according to an embodiment may generate the auto-pre-charge signal APCG at a time when a period determined according to a write latency and a write recovery time elapses in synchronization with the first operation clock signal SCLKA and the second operation clock signal SCLKB generated by dividing the clock signal CLK even when an auto-pre-charge command is inputted at a different time. The semiconductor device 10 according to an embodiment may share a shifting circuit used to apply the write recovery time in synchronization with the first operation clock signal SCLKA and the second operation clock signal SCLKB even when the auto-pre-charge command is inputted at a different time. Thus, a layout area and power consumption of the semiconductor device 10 may be reduced.

Figure 11:
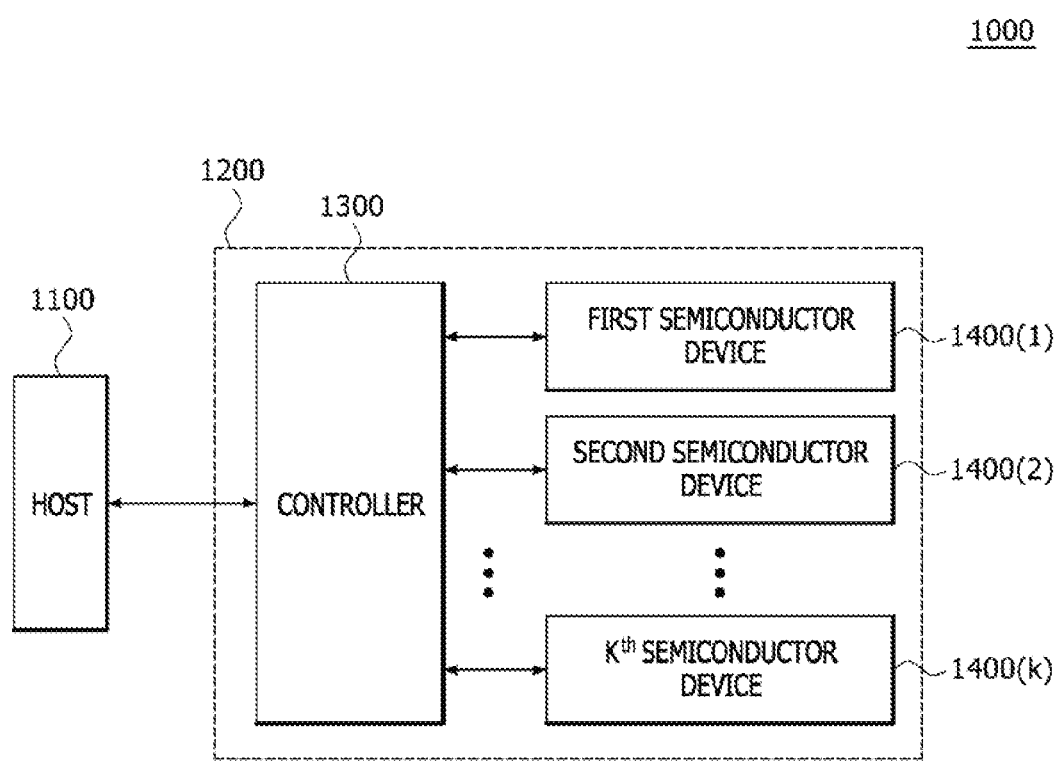
FIG. 11 is a block diagram illustrating a configuration of an electronic system employing the semiconductor device shown in FIG. 1.

FIG. 11 is a block diagram illustrating a configuration of an electronic system 1000 employing the semiconductor devices 10. As illustrated in FIG. 11, the electronic system 1000 may include a host 1100 and a semiconductor system 1200.

The host 1100 and the semiconductor system 1200 may transmit signals to each other by using an interface protocol. The interface protocol used for communication between the host 1100 and the semiconductor system 1200 may include any one of various interfaces such as a multi-media card (MMC), an enhanced small device interface (ESDI), an integrated drive electronics (IDE), a peripheral component interconnect-express (PCI-E), an advanced technology attachment (ATA), a serial ATA (SATA), a parallel ATA (PATA), a serial attached SCSI (SAS), and a Universal Serial Bus (USB).

The semiconductor system 1200 may include a controller 1300 and semiconductor devices 1400 (K:1). The controller 1300 may control the semiconductor devices 1400 (K:1) such that the auto-pre-charge signal APCG is generated at a time when a period determined according to the write latency and the write recovery time elapses in synchronization with the first operation clock signal SCLKA and the second operation clock signal SCLKB even when the auto-pre-charge command is inputted at a different time. Each of the semiconductor devices 1400 (K:1) may share a shifting circuit used to apply a write recovery time in synchronization with the first operation clock signal SCLKA and the second operation clock signal SCLKB even when an auto-pre-charge command is inputted at a different time. Thus, a layout area and power consumption of the semiconductor device 10 may be reduced.

Each of the semiconductor devices 1400 (K:1) may be realized using the semiconductor devices 10 illustrated in FIG. 1. In some embodiments, the semiconductor devices 10 may be realized using any one of a dynamic random access memory (DRAM), a phase change random access memory (PRAM), a resistive random access memory (RRAM), a magnetic random access memory (MRAM), and a ferroelectric random access memory (FRAM).

The various concepts have been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the concepts are not limited to the above descriptions but defined by the accompanying claims, and all of distinctive features in the equivalent scope should be construed as being included in the concepts.

What is claimed is:

1. A semiconductor device comprising:
    a flag shifting circuit configured to generate a first shifted flag signal by shifting a first flag signal by a second latency period, the first flag signal generated based on a first operation clock signal, and configured to generate a second shifted flag signal by shifting a second flag signal by a first latency period, the second flag signal generated based on a second operation clock signal; and
    an auto-pre-charge control circuit configured to generate an auto-pre-charge signal by shifting the first shifted flag signal and the second shifted flag signal by a recovery period based on the first operation clock signal and the second operation clock signal.

2. The semiconductor device of claim 1, wherein the first operation clock signal and the second operation clock signal are generated by dividing a clock signal.

3. The semiconductor device of claim 1,
    wherein the first flag signal is generated from a first write command signal and a first auto-pre-charge command signal;
    wherein the second flag signal is generated from a second write command signal and a second auto-pre-charge command signal;
    wherein the first write command signal and the first auto-pre-charge command signal are generated by decoding an internal control signal based on the first operation clock signal; and
    wherein the second write command signal and the second auto-pre-charge command signal are generated by decoding the internal control signal based on the second operation clock signal.

4. The semiconductor device of claim 1,
    wherein the second latency period is set based on a write latency, and
    wherein the first latency period is set based on the write latency.

5. The semiconductor device of claim 1,
    wherein the auto-pre-charge control circuit outputs the first shifted flag signal as an input auto-pre-charge signal when the first shifted flag signal is generated;
    wherein the auto-pre-charge control circuit shifts the input auto-pre-charge signal by a first period set according to the recovery period to output the shifted input auto-pre-charge signal as a pre-auto-pre-charge signal; and
    wherein the auto-pre-charge control circuit shifts the pre-auto-pre-charge signal by a second period to output the shifted pre-auto-pre-charge signal as the auto-pre-charge signal.

6. The semiconductor device of claim 5,
    wherein the first period is set to be a period obtained by subtracting one cycle of the first operation clock signal from the recovery period; and
    wherein the second period is set to be one cycle of the first operation clock signal.

7. The semiconductor device of claim 5,
    wherein the auto-pre-charge control circuit shifts the second shifted flag signal by a third period to output the shifted signal of the second shifted flag signal as the input auto-pre-charge signal when the second shifted flag signal is generated;
    wherein the auto-pre-charge control circuit generates and outputs the pre-auto-pre-charge signal by shifting the input auto-pre-charge signal by the first period set according to the recovery period; and
    wherein the auto-pre-charge control circuit shifts the pre-auto-pre-charge signal by a fourth period to output the shifted pre-auto-pre-charge signal as the auto-pre-charge signal.

8. The semiconductor device of claim 7, wherein the third period is set to be a half cycle of the first operation clock signal, and the fourth period is set to be a half cycle of the first operation clock signal.

9. The semiconductor device of claim 1,
    wherein the auto-pre-charge control circuit outputs one of the first shifted flag signal as an input auto-pre-charge signal and the input auto-pre-charge signal by shifting the second shifted flag signal by a first period, based on an input selection signal;

wherein the auto-pre-charge control circuit outputs a pre-auto-pre-charge signal by shifting the input auto-pre-charge signal by a second period set according to the recovery period; and wherein, based on an output selectin signal, the auto-pre-charge control circuit outputs a pre-charge signal by shifting the pre-auto-pre-charge signal by one of a third period and a fourth period.

10. The semiconductor device of claim 9, wherein the input selection signal is set to have a first logic level when the first shifted flag signal is generated, and the input selection signal is set to have a second logic level when the second shifted flag signal is generated.

11. The semiconductor device of claim 10, wherein the auto-pre-charge control circuit outputs the first shifted flag signal as the input auto-pre-charge signal when the input selection signal has the first logic level; and wherein the auto-pre-charge control circuit shifts the second shifted flag signal by the first period to output the shifted signal of the second shifted flag signal as the input auto-pre-charge signal when the input selection signal has the second logic level.

12. The semiconductor device of claim 11, wherein the first period is set to be a half cycle of the first operation clock signal, and the second period is set to be a period obtained by subtracting one cycle of the first operation clock signal from the recovery period.

13. The semiconductor device of claim 9, wherein the output selection signal is set to have a first logic level when the first shifted flag signal is generated, and the output selection signal is set to have a second logic level when the second shifted flag signal is generated.

14. The semiconductor device of claim 13, wherein the auto-pre-charge control circuit outputs the pre-charge signal by shifting the pre-auto-pre-charge signal by a third period when the output selection signal has the first logic level and outputs the pre-charge signal by shifting the pre-auto-pre-charge signal by the fourth period when the output selection signal has the second logic level.

15. The semiconductor device of claim 14, wherein the third period is set to be a half cycle of the first operation clock signal, and the fourth period is set to be one cycle of the first operation clock signal.

16. The semiconductor device of claim 9, wherein the auto-pre-charge control circuit includes:

an input and output control signal generation circuit configured to generate an input control signal based on the input auto-pre-charge signal, configured to generate a pre-output control signal based on the pre-auto-pre-charge signal, and configured to generate an output control signal based on the pre-charge signal; and a selection signal generation circuit configured to generate the input selection signal based on the first shifted flag signal and the second shifted flag signal and configured to generate the output selection signal based on the input control signal, the pre-output control signal, and the input selection signal.

17. The semiconductor device of claim 16, wherein the auto pre-charge control circuit further includes an auto-pre-charge address generation circuit configured to latch an address signal based on the input control signal and configured to output the latched address signal as an auto-pre-charge address signal based on the pre-output control signal.

18. A semiconductor device comprising:

an auto-pre-charge control circuit configured to output one of a first shifted flag signal as an input auto-pre-charge signal and the input auto-pre-charge signal by shifting a second shifted flag signal by a first period based on an input selection signal, configured to output a pre-auto-pre-charge signal by shifting the input auto-pre-charge signal by a second period set according to a recovery period, and configured to output, based on an output selection signal, a pre-charge signal by shifting the pre-auto-pre-charge signal by one of a third period and a fourth period.

19. The semiconductor device of claim 18, wherein the auto-pre-charge control circuit outputs the first shifted flag signal as the input auto-pre-charge signal when the first shifted flag signal is generated to set the input selection signal to a first logic level and outputs the input auto-pre-charge signal by shifting the second shifted flag signal by the first period when the second shifted flag signal is generated to set the input selection signal to a second logic level.

20. The semiconductor device of claim 18, wherein the first period is set to be a half cycle of a first operation clock signal, and the second period is set to be a period obtained by subtracting one cycle of the first operation clock signal from the recovery period.

21. The semiconductor device of claim 18, wherein the auto-pre-charge control circuit outputs the pre-charge signal by shifting the pre-auto-pre-charge signal by the third period when the first shifted flag signal is generated to set the output selection signal to a first logic level and outputs the pre-charge signal by shifting the pre-auto-pre-charge signal by the fourth period when the second shifted flag signal is generated to set the output selection signal to a second logic level.

22. The semiconductor device of claim 21, wherein the third period is set to be a half cycle of a first operation clock signal, and the fourth period is set to be one cycle of the first operation clock signal.

23. The semiconductor device of claim 18, wherein the auto-pre-charge control circuit includes:

an input and output control signal generation circuit configured to generate an input control signal based on the input auto-pre-charge signal, configured to generate a pre-output control signal based on the pre-auto-pre-charge signal, and configured to generate an output control signal based on the pre-charge signal; and a selection signal generation circuit configured to generate the input selection signal based on the first shifted flag signal and the second shifted flag signal and configured to generate the output selection signal based on the input control signal, the pre-output control signal, and the input selection signal.

24. The semiconductor device of claim 23, wherein the auto pre-charge control circuit further includes an auto-pre-charge address generation circuit configured to latch an address signal based on the input control signal and configured to output the latched address signal as an auto-pre-charge address signal based on the pre-output control signal.

25. The semiconductor device of claim 18, further comprising:

a flag shifting circuit configured to generate the first shifted flag signal by shifting a first flag signal by a second latency period, the first flag signal generated based on a first operation clock signal, and configured to generate the second shifted flag signal by shifting a second flag signal by a first latency period, the second flag signal generated based on a second operation clock signal.

26. The semiconductor device of claim 25, wherein the first operation clock signal and the second operation clock signal are generated by dividing a clock signal.

27. The semiconductor device of claim 25,
wherein the first flag signal is generated from a first write command signal and a first auto-pre-charge command signal;
wherein the second flag signal is generated from a second write command signal and a second auto-pre-charge command signal;
wherein the first write command signal and the first auto-pre-charge command signal are generated by decoding an internal control signal based on the first operation clock signal; and
wherein the second write command signal and the second auto-pre-charge command signal are generated by decoding the internal control signal based on the second operation clock signal.

\* \* \* \* \*